(12) United States Patent
Koide

(10) Patent No.: US 6,765,234 B2
(45) Date of Patent: Jul. 20, 2004

(54) SEMICONDUCTOR LIGHT EMITTING DEVICE AND METHOD FOR PRODUCING THE SAME

(75) Inventor: Norikatsu Koide, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 112 days.

(21) Appl. No.: 10/032,086

(22) Filed: Dec. 21, 2001

(65) Prior Publication Data

US 2002/0079498 A1 Jun. 27, 2002

(30) Foreign Application Priority Data

Dec. 26, 2000 (JP) ........................................ 2000-396324

(51) Int. Cl.[7] .............................................. H01L 33/00
(52) U.S. Cl. ........................ 257/88; 257/103; 257/628
(58) Field of Search ........................ 257/88, 103, 627, 257/628

(56) References Cited

U.S. PATENT DOCUMENTS

| | | | | |
|---|---|---|---|---|
| 4,984,034 A | * | 1/1991 | Yamazaki | 357/17 |
| 5,952,680 A | * | 9/1999 | Strite | 357/88 |
| 6,110,277 A | * | 8/2000 | Braun | 117/94 |
| 6,222,205 B1 | * | 4/2001 | Geng et al. | 257/96 |
| 6,410,942 B1 | * | 6/2002 | Thibeault et al. | 257/88 |
| 6,617,668 B1 | * | 9/2003 | Koide et al. | 257/615 |

FOREIGN PATENT DOCUMENTS

JP        10-321911        12/1998

* cited by examiner

*Primary Examiner*—Sara Crane
(74) *Attorney, Agent, or Firm*—Morrison & Foerster LLP (57) ABSTRACT

A semiconductor light emitting device includes: a silicon substrate; and a plurality of column-shaped multilayered structures formed on the silicon substrate in such a manner that the column-shaped multilayered structures are insulated from one another, the column-shaped multilayered structures being made of a nitride semiconductor material, and each column-shaped multilayered structure including a light emitting layer, wherein the column-shaped multilayered structures are connected to one another by an electrode.

12 Claims, 8 Drawing Sheets

SEMICONDUCTOR LIGHT EMITTING DEVICE AND METHOD FOR PRODUCING THE SAME

BACKGROUND OF THE INVENTION

1. Field of the Invention

The present invention relates to a semiconductor light emitting device and a method for producing the same. Specifically, the present invention relates to a semiconductor light emitting device wherein a nitride semiconductor layer is provided on a silicon substrate (Si substrate) as a light emitting layer, and a method for producing the same.

2. Description of the Related Art

Usually, in a light emitting device using a nitride semiconductor material, such as GaN, InN, AlN, or a mixed crystal thereof, a nitride semiconductor film, e.g., an $In_xGa_{1-x}N$ crystal layer, is provided on a sapphire substrate as a light emitting layer.

However, in recent years, a silicon (Si) substrate which is less expensive than a sapphire substrate and which has a larger area than that of the sapphire substrate has been used. When using such a Si substrate as a substitute for a sapphire substrate, a less expensive nitride semiconductor light emitting device can be produced.

In the case where a nitride semiconductor light emitting device is produced using a Si substrate, if the temperature of a nitride semiconductor film is decreased to room temperature after epitaxial growth has been performed at a high temperature, the nitride semiconductor film shrinks considerably in comparison to the Si substrate due to a difference in the thermal expansion coefficient between the Si substrate and the nitride semiconductor film, the nitride semiconductor film having a larger thermal expansion coefficient than that of the Si substrate.

Figure 8:
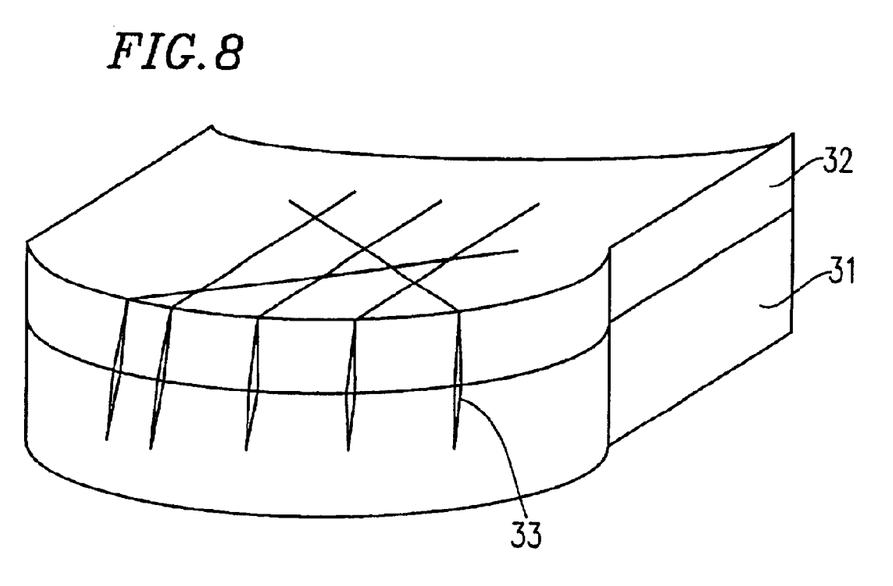
FIG. 8 is a schematic diagram showing a structure of a conventional semiconductor light emitting device.

FIG. 8 is a schematic diagram showing a structure of a nitride semiconductor light emitting device using a Si substrate. As shown in FIG. 8, if the temperature of a nitride semiconductor film 32 is decreased to room temperature after the nitride semiconductor film 32 has epitaxially grown over a Si substrate 31 at a high temperature, the nitride semiconductor film 32 shrinks considerably. This shrinkage causes tensile stress at the interface of the Si substrate 31 and the nitride semiconductor film 32. As a result, cracks 33 may be formed in both the nitride semiconductor film and the Si substrate as shown in FIG. 8.

When such cracks 33 are formed in a nitride semiconductor light emitting device having a double heterostructure, the amount of leak current, which does not contribute to the emission of light, is increased. As a result, the semiconductor light emitting device cannot emit light with high brightness.

SUMMARY OF THE INVENTION

According to one aspect of the present invention, a semiconductor light emitting device includes: a silicon substrate; and a plurality of column-shaped multilayered structures formed on the silicon substrate in such a manner that the column-shaped multilayered structures are insulated from one another, the column-shaped multilayered structures being made of a nitride semiconductor material, and each column-shaped multilayered structure including a light emitting layer, wherein the column-shaped multilayered structures are connected to one another by an electrode.

In one embodiment of the present invention, an insulating film is provided on the silicon substrate for insulating the column-shaped multilayered structures from one another.

In another embodiment of the present invention, the column-shaped multilayered structures are arranged with an interval of 5–20 μm therebetween.

In still another embodiment of the present invention, the column-shaped multilayered structures are arranged in a matrix along a <11-2> crystal direction and a direction orthogonal to the <11-2> crystal direction over the silicon substrate.

In still another embodiment of the present invention, a cross-section of each column-shaped multilayered structure has the shape of a square or a rectangle.

In still another embodiment of the present invention, a cross-section of each column-shaped multilayered structure has the shape of a triangle.

In still another embodiment of the present invention, the length of each column-shaped multilayered structure along a direction orthogonal to the <11-2> crystal direction of the silicon substrate is 100 μm or smaller.

In still another embodiment of the present invention, the electrode which connects the column-shaped multilayered structures to one another is a transparent electrode which allows transmission of light emitted by the column-shaped multilayered structures through the transparent electrode.

In still another embodiment of the present invention, the electrode which connects the column-shaped multilayered structures to one another is provided with a bonding electrode for supplying an external electric current to the electrode.

In still another embodiment of the present invention, the column-shaped multilayered structures emit light having the same wavelength.

In still another embodiment of the present invention, light emitted by each of the column-shaped multilayered structures has any of a plurality of predetermined different wavelengths.

In still another embodiment of the present invention, adjacent column-shaped multilayered structures are electrically connected by a conductor.

According to another aspect of the present invention, a method for producing a semiconductor light emitting device includes steps of: providing an insulating film having a plurality of opening portions on a silicon substrate; forming column-shaped multilayered structures of a nitride semiconductor material in the opening portions of the insulating film, each column-shaped multilayered structure including a light emitting layer; and forming an electrode for electrically connecting the column-shaped multilayered structures to one another.

Thus, the invention described herein makes possible the advantages of providing a nitride semiconductor light emitting device which has a long effective lifetime and which emits light with a high brightness, and a production method thereof.

These and other advantages of the present invention will become apparent to those skilled in the art upon reading and understanding the following detailed description with reference to the accompanying figures.

DESCRIPTION OF THE PREFERRED EMBODIMENTS

Hereinafter, an embodiment of the present invention will be described with reference to the drawings.

Figure 1:
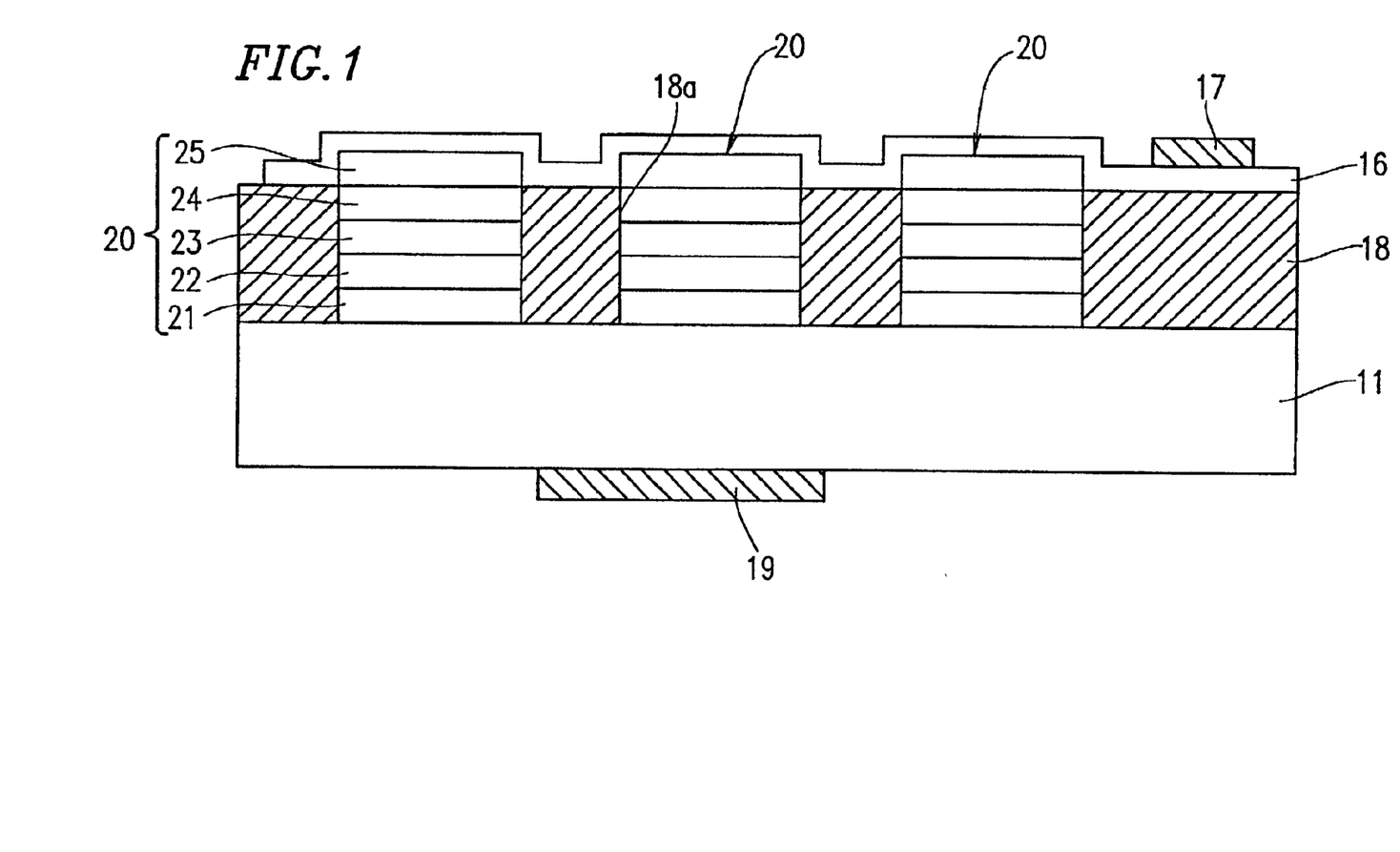
FIG. 1 is a schematic cross-sectional view showing an exemplary embodiment of a semiconductor light emitting device of the present invention.
Figure 2:
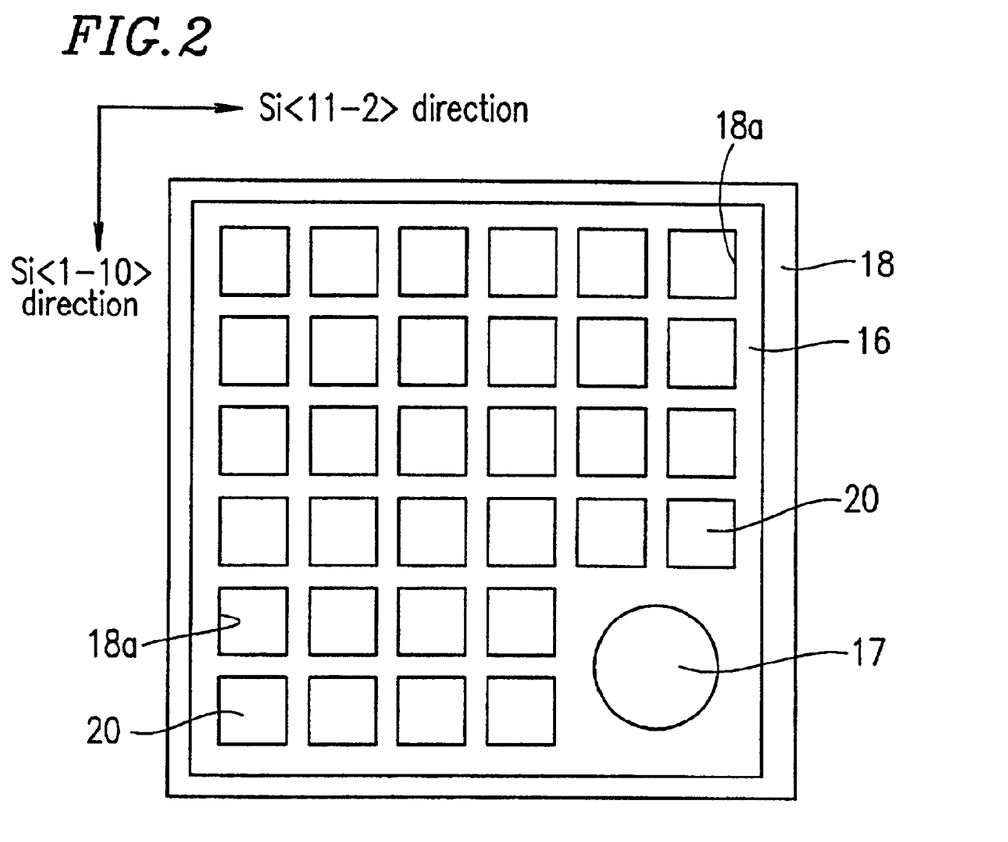
FIG. 2 is a plan view of the semiconductor light emitting device shown in FIG. 1.

FIG. 1 is a schematic cross-sectional view showing an exemplary embodiment of a nitride semiconductor light emitting device of the present invention. FIG. 2 is a schematic plan view of the nitride semiconductor light emitting device shown in FIG. 1. This nitride semiconductor light emitting device includes a Si substrate 11, which is a (111) substrate, and an insulating film 18 of a suitable thickness which is provided over the Si substrate 11 so as to cover an upper surface of the Si substrate 11 except for a plurality of separate regions on which crystals are to be grown. The insulating film 18 is made of, for example, silicon oxide.

The insulating film 18 has many opening portions 18a, in which column-shaped multilayered structures 20 are formed by crystal growth of nitride semiconductor material, except for one of the corners of the Si substrate 11. Each of the opening portions 18a penetrates through the insulating film 18. Thus, the upper surface of the Si substrate 11 is exposed in each of the opening portions 18a before the column-shaped multilayered structures 20 are formed. As shown in FIG. 2, each of the opening portions 18a has a square shape. The opening portions 18a are arranged in a matrix along the <11-2> direction and <1-10> direction, which are crystal growth directions of a nitride semiconductor material grown on the Si substrate 11.

The column-shaped multilayered structures 20, which are formed in the opening portions 18a of the insulating film 18, include a buffer layer 21 made of Si-doped n-AlInN. The buffer layer 21 is provided on the upper surface of the Si substrate 11. The column-shaped multilayered structures 20 further include, on the buffer layer 21, a first cladding layer 22 made of n-GaInN, a light emitting layer 23 made of $In_xGa_{1-x}N$, a carrier blocking layer 24 made of p-AlGaInN, and a second cladding layer 25 made of p-GaInN in this order.

The second cladding layer 25 exists at a level higher than the upper surface of the insulating film 18. Over substantially the entire upper surface of the insulating film 18, a transparent electrode 16 is provided so as to cover the second cladding layer 25. Thus, in all of the column-shaped multilayered structures 20, the second cladding layer 25 is in direct contact with the transparent electrode 16. Hence, all of the column-shaped multilayered structures 20 are electrically connected to one another.

Over a portion of the transparent electrode 16 at a corner of the insulating film 18, a cylinder-shaped bonding electrode 17 is provided for supplying an external electric current to the transparent electrode 16. On the back face of the Si substrate 11, a back face electrode 19 is provided.

In the light emitting layer 23 made of $In_xGa_{1-x}N$, the band-to-band emission wavelength can be changed from an ultraviolet range to a red light range by changing the composition ratio of In, i.e., the value of x. In this embodiment, the composition ratio of In, x, is set such that the light emitting layer 23 emits blue light in all of the column-shaped multilayered structures 20.

The transparent electrode 16, which is connected to the second cladding layer 25 made of p-GaInN, is made of a metal film or ITO film having a thickness of 20 nm or less. It is preferable that the ITO film includes any metal among Ta, Co, Rh, Ni, Pd, Pt, Cu, Ag, and Au.

The back face electrode 19 formed on the back face of the Si substrate 11 is made of metal. Especially, it is preferable that the back face electrode 19 includes any of Al, Ti, Zr, Hf, V, and Nb.

The nitride semiconductor light emitting device having such a structure can be produced as described below. In a first step, a silicon oxide film is formed by sputtering over the cleaned Si substrate 11 so as to form the insulating film 18 having a predetermined thickness, e.g., 700 nm. The insulating film 18 may be made of a silicon nitride film in place of the silicon oxide film.

After the silicon oxide film has been formed over the Si substrate 11 so as to have the predetermined thickness, a plurality of opening portions 18a each having, for example, a square shape, are formed by photolithography and etching techniques in a predetermined matrix arrangement.

In this way, a number of opening portions 18a are formed in the insulating film 18 such that the surface of the Si substrate 11 is exposed via the opening portions 18a. Then, the exposed surface of the Si substrate 11 is cleaned. Thereafter, the resultant structure including the Si substrate 11 and the insulating film 18 formed thereon is introduced to an MOCVD equipment. After being introduced to the MOCVD equipment, the Si substrate 11 is cleaned at a high temperature of about 1100° C. in a hydrogen ($H_2$) atmosphere.

Thereafter, into the MOCVD equipment where the substrate temperature is 800° C., $N_2$ as carrier gas at a flow rate of 10 L/min, $NH_3$ at a flow rate of 5 L/min, trimethylaluminum (TMA) at a flow rate of 20 $\mu$mol/min, and trimethylindium (TMI) at a flow rate of 137 $\mu$mol/min are supplied, and a few seconds after, $SiH_4$ gas is introduced into the MOCVD equipment, whereby a Si-doped $Al_{0.85}In_{0.15}N$ buffer layer 21 is crystally-grown in the opening portions 18a of the insulating film 18 so as to have a thickness of about 30 nm.

In the crystal growth using this MOVPE method, the organic metals (TMA and TMI), which are III-group source material gases, are supplied a few seconds earlier than the $NH_3$ gas which is a V-group source material gas, whereby the $Al_{0.85}In_{0.15}N$ buffer layer 21 can be formed so as to have a flat surface. If the $NH_3$ gas was supplied earlier than the organic metals, the surface of the Si substrate 11 would be nitrided. In this embodiment, the organic metals are supplied earlier than the $NH_3$ gas, whereby the surface of the Si substrate 11 is prevented from being nitrided. This is because the III-group elements are arranged over the surface of the Si substrate 11, i.e., the interface between the Si substrate 11 and the nitride semiconductor. The timing of when the organic metals are supplied before the $NH_3$ gas is different among MOCVD equipments.

When forming the $Al_{0.85}In_{0.15}N$ buffer layer 21 by crystal growth on the Si substrate 11 while maintaining the same In composition ratio, an $Al_{0.95}In_{0.05}N$ layer having a thickness of 20 nm and having a higher Al composition ratio may be provided under the interface between the buffer layer 21, i.e., at the interface between the buffer layer 21 and the Si substrate 11. In this case, the interface of the column-shaped multilayered structures 20 and the Si substrate 11 is provided in a good state, e.g., tensile stress is relaxed.

After the $Al_{0.85}In_{0.15}N$ buffer layer 21 has been formed, while the substrate temperature is maintained at 800° C., the supply of TMA is stopped, and an Si-doped $Ga_{0.92}In_{0.08}N$ is crystally-grown so as to form an n-type first cladding layer 22 having a thickness of about 300 nm.

The n-type first cladding layer 22 may be a GaN film which is formed by increasing the growth temperature after the $Al_{0.85}In_{0.15}N$ buffer layer 21 has been formed. Furthermore, a GaInN film, which includes In, but does not include Al, may be used as the n-type first cladding layer 22. In the case of using the GaInN film, generation of cracks in the Si substrate 11 can be suppressed because the GaInN film can be grown at a low temperature, i.e., it is not necessary to increase the growth temperature to a high temperature.

Thereafter, the supply of TMA, TMI, and TMG is stopped, and the substrate temperature is decreased to 760° C. Under such conditions, trimethylindium (TMI), which is an indium source, at a flow rate of 6.5 $\mu$mol/min and TMG at a flow rate of 2.8 $\mu$mol/min are introduced into the MOCVD equipment, such that an $In_{0.18}Ga_{0.82}N$ well layer having a thickness of 3 nm is grown. Then, the substrate temperature is increased to 850° C., and TMG is introduced into the MOCVD equipment at a flow rate of 14 $\mu$mol/min, such that a GaN barrier layer is grown. Thereafter, growth of well layers and barrier layers is repeated in a similar manner, such that a multi-quantum well (MQW) layer including five well layers and five barrier layers, for example, between and over the well layers is formed. In this way, the light emitting layer 23 is formed.

After the formation of the light emitting layer 23 is completed, while the temperature is maintained at the growth temperature for the uppermost barrier layer, TMG at a flow rate of 11 $\mu$mol/min, TMA at a flow rate of 1.1 $\mu$mol/min, and TMI at a flow rate of 40 $\mu$mol/min are supplied to the MOCVD equipment. Simultaneously, biscyclopentadienyl magnesium ($Cp_2Mg$), which is a source material of p-type dopant gas, is also supplied at a flow rate of 10 nmol/min to the MOCVD equipment. As a result, a Mg-doped $Al_{0.20}Ga_{0.75}In_{0.05}$ is crystally-grown so as to form a p-type carrier blocking layer 24 having a thickness of 50 nm.

After the growth of the p-type carrier blocking layer 24 is completed, the supply of TMA is stopped, while the growth temperature is maintained at the same temperature. As a result, Mg-doped $Ga_{0.9}In_{0.1}N$ is crystally-grown so as to form a p-type second cladding layer 25 having a thickness of 80 nm.

In this way, the column-shaped multilayered structures 20 are formed in the opening portions 18a of the insulating film 18, and the supply of TMG, TMI, and $Cp_2Mg$ is stopped. Then, the resultant device structure is cooled to room temperature and is removed from the MOCVD equipment.

Thereafter, the transparent electrode 16 is formed over the entire upper surface of the insulating film 18 so as to cover the second cladding layer 25 made of p-type $Ga_{0.9}In_{0.1}N$ which is the uppermost layer of the column-shaped multilayered structures 20. Thus, the column-shaped multilayered structures 20, which are separated from one another by the insulating film 18, are electrically connected to one another via the thin transparent electrode 16.

After the transparent electrode 16 has been formed, over one of the corners of the transparent electrode 16 where a column-shaped multilayered structure 20 is not formed, the bonding electrode 17 is formed, and meanwhile, the back face electrode 19 is formed on the back face of the Si substrate 11. Thus, the nitride semiconductor light emitting device shown in FIGS. 1 and 2 is obtained.

In the thus-produced nitride semiconductor light emitting device, when a voltage is externally applied to the transparent electrode 16 via the bonding electrode 17, the voltage is applied to the respective column-shaped multilayered structures 20 which are electrically insulated from each other by the insulating film 18. As a result, a voltage difference is caused between the applied voltage and the voltage at the back face electrode 19 on the back face of the Si substrate 11, whereby light is emitted by the light emitting layer 23 of the column-shaped multilayered structures 20. The light emitted by the light emitting layer 23 is output upwardly from the upper faces of the column-shaped multilayered structures 20 through the transparent electrode 16.

As described above, in the light emitting device of the present invention, a number of column-shaped multilayered structures 20 are formed on the Si substrate 11 and are insulated from each other by the insulating film 18, such that the area occupied by the column-shaped multilayered structures 20 over the Si substrate 11 is relatively small in comparison to conventional structures. Thus, a tensile stress which may be caused between the column-shaped multilayered structures 20 and the Si substrate 11 is relaxed. As a result, the probability that a crack is generated in the Si substrate 11 is eliminated.

In the above-described embodiment, after the insulating film 18 having a plurality of opening portions 18a is formed so as to have a predetermined thickness, the column-shaped multilayered structures 20 are formed in the opening portions 18a. However, according to the present invention, an alternative structure is possible. For example, a silicon oxide film having a suitable thickness thinner than that of the column-shaped multilayered structures 20 is formed on the Si substrate 11, and a plurality of opening portions are formed at predetermined positions in the silicon oxide film. In the opening portions, the column-shaped multilayered structures 20 are formed in a manner similar to that described above so as to be thicker than the silicon oxide film, and then, the silicon oxide film is again formed so as to have a predetermined thickness.

Figure 3:
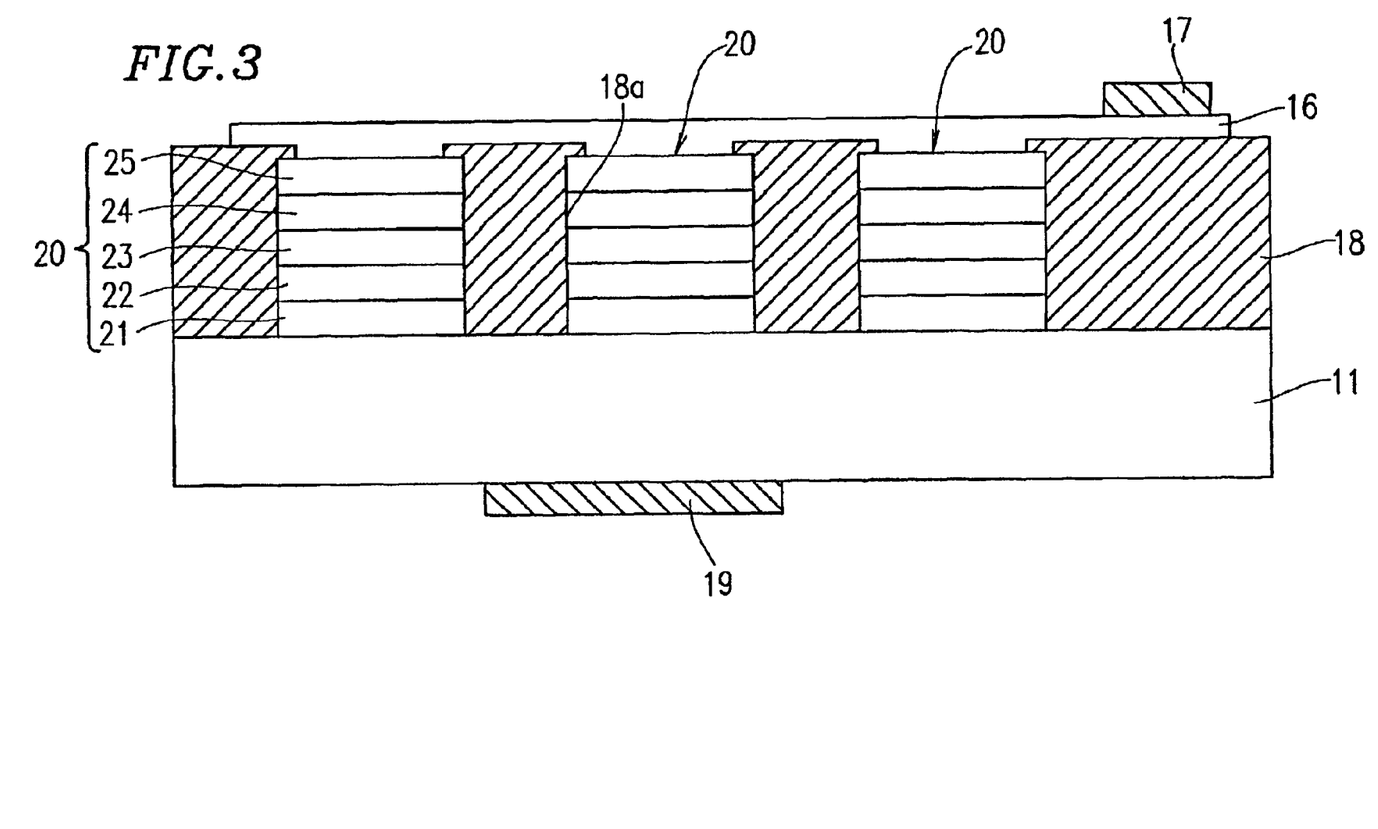
FIG. 3 is a schematic cross-sectional view showing another exemplary embodiment of a semiconductor light emitting device of the present invention.

In this case, as shown in FIG. 3, the column-shaped multilayered structures 20 are buried in the insulating film 18. Over the entire upper surface of the insulating film 18, a transparent electrode 16 is formed, whereby the upper surfaces of the column-shaped multilayered structures 20, which are exposed through the opening portions 18a of the insulating film 18, are in contact with the transparent electrode 16. Then, as described above in connection with the nitride light emitting device shown in FIG. 1, a bonding electrode 17 is formed at a predetermined position on the transparent electrode 16, and a back face electrode 19 is formed on the back face of the Si substrate 11.

Figure 4:
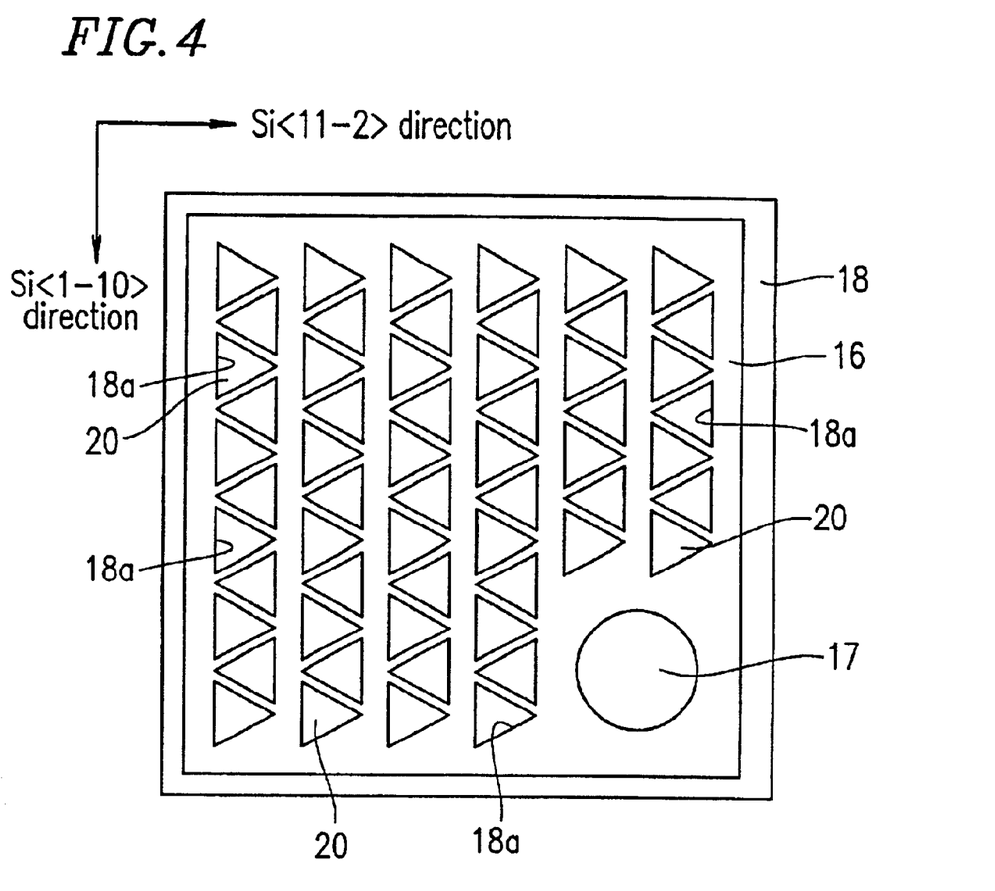
FIG. 4 is a schematic plan view showing still another exemplary embodiment of a semiconductor light emitting device of the present invention.

Alternatively, as shown in FIG. 4, the opening portions 18a are formed in the insulating film 18 provided on the Si substrate 11 so as to have a regular triangular shape. The triangular opening portions 18a are aligned along a <1-10> crystal direction such that one of the sides of each triangular opening portion 18a is parallel to the <1-10> crystal direction which is orthogonal to a <11-2> crystal direction of the Si substrate 11 which is a (111) substrate. In this case, in one type of triangular opening portion 18a, a vertex of the triangle which faces the side of the triangle that is parallel to the <1-10> direction is positioned in the <11-2> direction with respect to the <1-10> direction. In the other type of triangular opening portion 18a, a vertex of the triangle which faces the side of the triangle that is parallel to the <1-10> direction is positioned in a direction opposite to the <11-2> direction with respect to the <1-10> direction. In each line of the opening portions 18a, these two types of opening portions 18a are alternately provided along the <1-10> direction.

In the opening portions 18a of the insulating film 18 having the above structure, the column-shaped multilayered structures 20 are formed as described above. Then, a transparent electrode 16, a bonding electrode 17, and a back face electrode 19 are formed, thereby completing a nitride semiconductor light emitting device.

In the nitride semiconductor light emitting device having such a structure, a crack may be formed along the <11-2> direction in the nitride semiconductor film. In the Si (111) substrate, Si is epitaxially grown along the <11-2> axial direction which is in parallel to the <1-10> axial direction of Si. Thus, as shown in FIG. 4, triangular masks are formed along a direction parallel to the <1-10> direction of the Si substrate, whereby formation of a crack in the column-shaped multilayered structures 20 is more securely prevented.

It is preferable that the column-shaped multilayered structures 20 are formed on the Si substrate 11 at an interval of 5–20 μm. If the interval of the column-shaped multilayered structures 20 is greater than 20 μm, the number of the column-shaped multilayered structures 20 which can be provided over the Si substrate 11 is decreased, and accordingly, the intensity of light emitted from the entire nitride semiconductor light emitting device is decreased. Further, if the interval of the column-shaped multilayered structures 20 is smaller than 5 μm, the column-shaped multilayered structures 20 are provided over the Si substrate 11 with high density, such that high stress is caused by the column-shaped multilayered structures 20 on the Si substrate 11. Thus, there occurs a probability that a crack is generated, and the emission intensity of the light emitting device is decreased.

From various experiments conducted by the present inventor, it is known that, when the opening area of each opening portion 18a is large, the emission intensity of the entire light emitting device is decreased. For example, in the nitride semiconductor light emitting device having the triangular opening portions 18a shown in FIG. 4, when a side of the triangular opening portion 18a which is parallel to the <1-10> direction and orthogonal to the <11-2> direction has a length equal to or greater than 150 μm, the emission intensity becomes lower.

Figure 5:
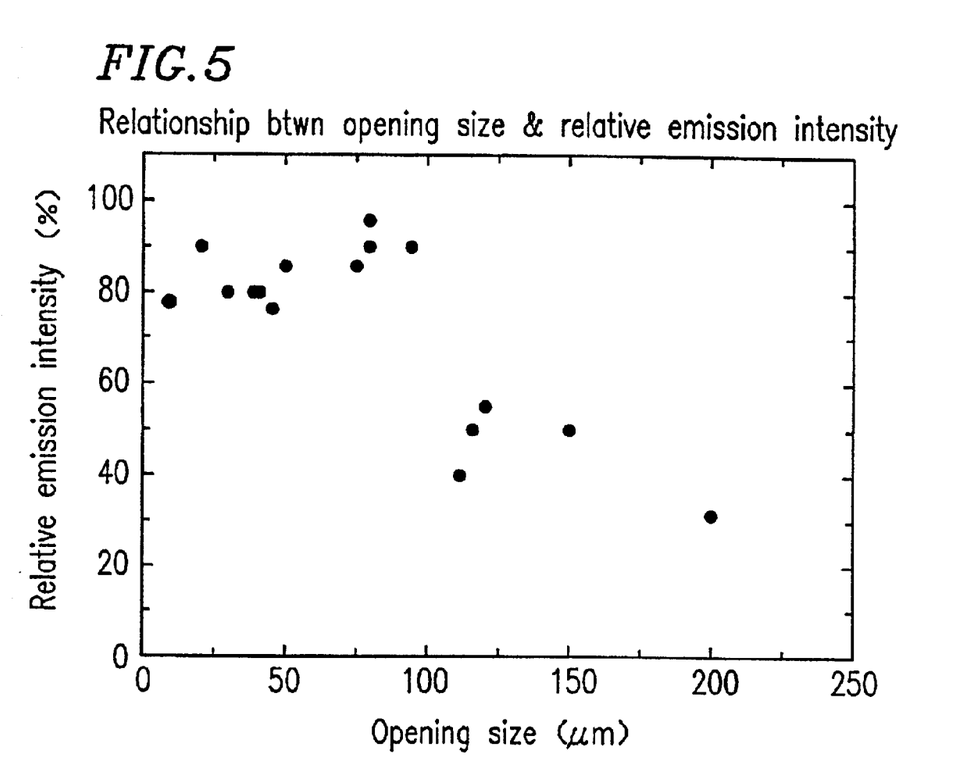
FIG. 5 is a graph showing a relationship between a relative emission intensity, which is obtained after 1000-hour operation with respect to an initial emission intensity, and the length of a side of an opening portion formed in an insulating film, in a semiconductor light emitting device of the present invention.

FIG. 5 is a graph showing a relationship between a relative emission intensity, which is obtained after 1000-hour operation with respect to an initial emission intensity, and the length of a side of an opening portion formed in an insulating film, in the semiconductor light emitting device having triangular opening portions as described above. As apparent from FIG. 5, when one side of a triangular opening portion 18a is longer than 100 μm, the relative emission intensity is lower. Therefore, by setting the length of one side of a triangular opening portion 18a so as to be equal to or less than 100 μm, a decrease in the emission intensity along with the passage of time is suppressed. Thus, a long effective lifetime can be obtained for the nitride semiconductor light emitting device according to the present invention.

In the above-described embodiment, the column-shaped multilayered structures 20, which are formed in the triangular opening portions 18a of the insulating film 18, all have the same structure and emit light of the same color. However, the present invention is not limited to such a structure or operation. For example, the composition ratio of the nitride semiconductor can be changed among the column-shaped multilayered structures 20, such that the column-shaped multilayered structures 20 emit light of different colors. For example, when each column-shaped multilayered structure 20 is designed so as to emit light of any color among the three primary colors, and is provided with a switching element, such as a transistor, and a driving circuit therefor, a display device which can produce a color image with high definition can be obtained.

Figure 6:
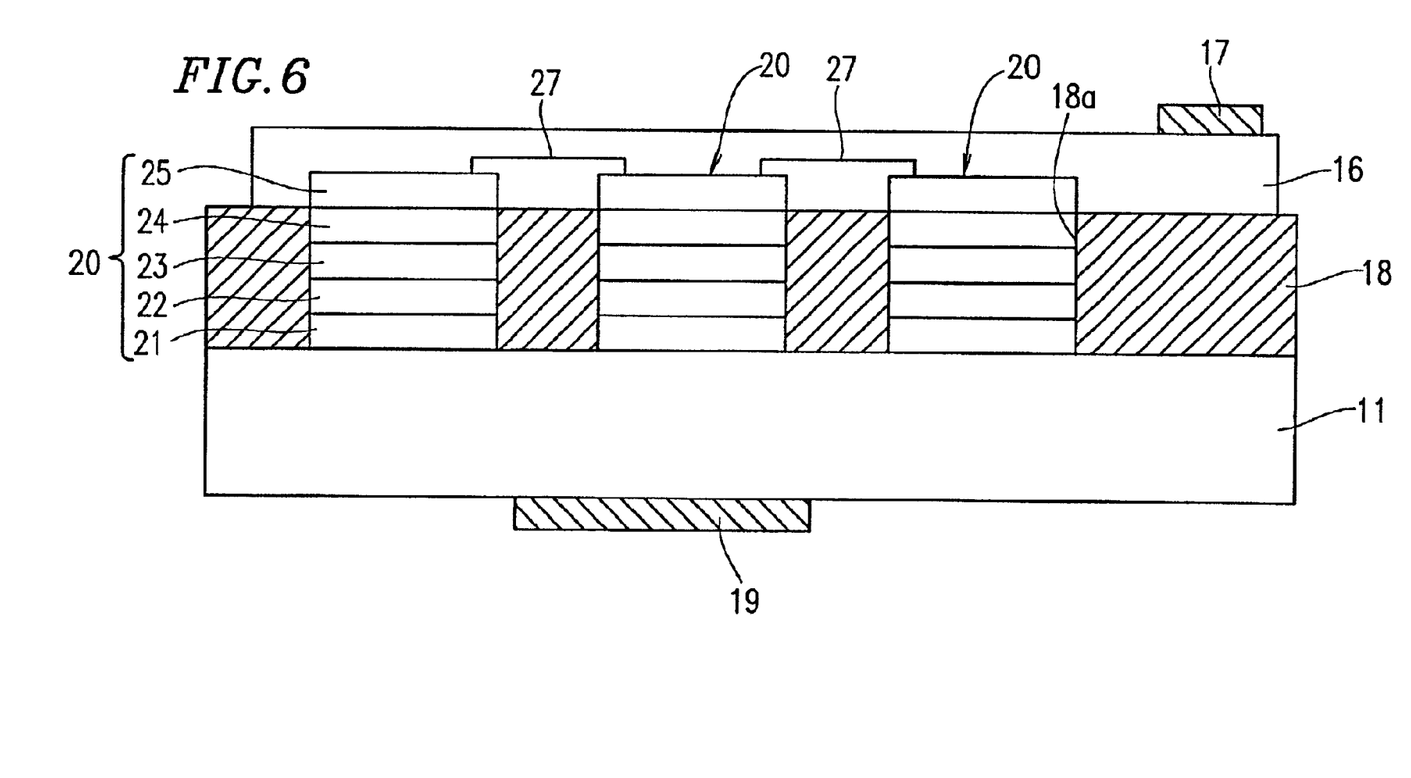
FIG. 6 is a schematic cross-sectional view showing still another exemplary embodiment of a semiconductor light emitting device of the present invention.

In the nitride semiconductor light emitting device shown in FIG. 1, all of the column-shaped multilayered structures 20 are electrically connected by the transparent electrode 16. Alternatively, according to the present invention, a device structure shown in FIG. 6 can also be employed. As shown in FIG. 6, between adjacent column-shaped multilayered structures 20, the second cladding layers 25 extending from the opening portions 18a over the insulating film 18 are directly connected by a conductor 27 provided so as to fill the space between the second cladding layers 25 and so as to cover at least a portion of each of the second cladding layers 25. The transparent electrode 16 may be provided so as to cover an entire upper surface of the resultant structure.

With such a structure, resistance (sheet resistance) in a lateral direction along which the column-shaped multilayered structures 20 are connected can be reduced, and accordingly, the driving voltage of the entire semiconductor light emitting device can be reduced.

In this case, it is preferable that the transparent electrode 16 be formed so as to have a sufficient thickness such that the transparent electrode 16 is prevented from being disconnected by an edge of the conductor 27.

Figure 7:
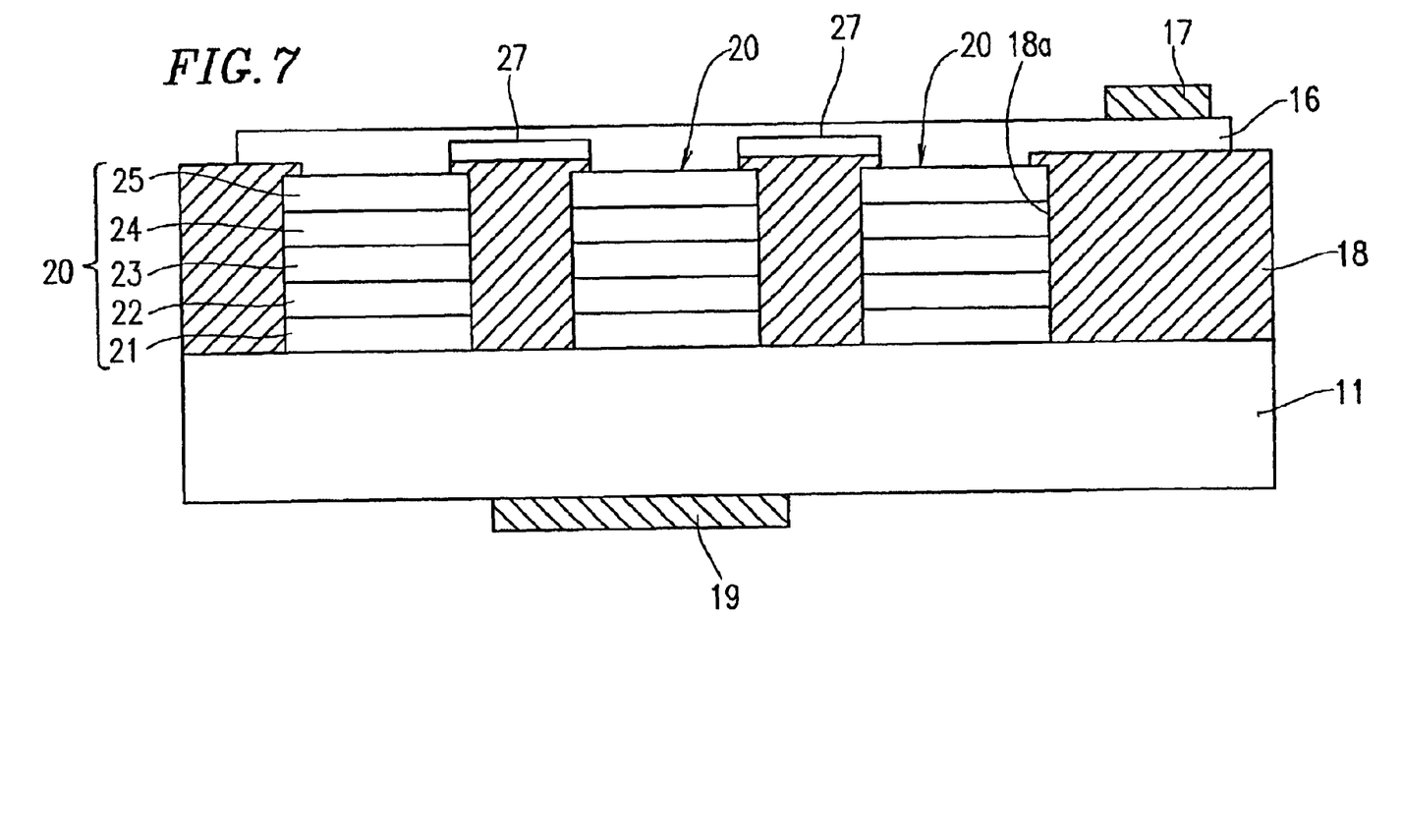
FIG. 7 is a schematic cross-sectional view showing still another exemplary embodiment of a semiconductor light emitting device of the present invention.

Alternatively, as a variation of the nitride semiconductor light emitting device shown in FIG. 3, a device structure shown in FIG. 7 where a conductor 27 is provided on the insulating film 18 between adjacent column-shaped multilayered structures 20 can be employed. Also in this structure, resistance (sheet resistance) in a lateral direction along which the column-shaped multilayered structures 20 are connected can be reduced, and accordingly, the driving voltage of the entire semiconductor light emitting device can be reduced. In this case also, it is preferable that the transparent electrode 16 be formed so as to have a sufficient thickness such that the transparent electrode 16 is prevented from being disconnected by an edge of the conductor 27.

As described above, in a semiconductor light emitting device of the present invention, a plurality of layered structures made of nitride semiconductor material are separately formed over a silicon substrate. Thus, a stress imposed onto the silicon substrate, which may be caused due to a temperature variation after a crystal growth process, is reduced, and generation of cracks can be prevented. As a result, a long effective lifetime and high brightness can be obtained for the semiconductor light emitting device according to the present invention. Furthermore, according to a method for producing a semiconductor light emitting device of the present invention, such a semiconductor light emitting device can be readily produced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting device, comprising:

a silicon substrate; and a plurality of column-shaped multilayered structures formed directly on the silicon substrate in such a manner that the column-shaped multilayered structures are insulated from one another, the column-shaped multilayered structures being made of a nitride semiconductor material, and each column-shaped multilayered structure including a light emitting layer, wherein the column-shaped multilayered structures are connected to one another by an electrode.

2. A semiconductor light emitting device according to claim 1, wherein an insulating film is provided on the silicon substrate for insulating the column-shaped multilayered structures from one another.

3. A semiconductor light emitting device according to claim 1, wherein the column-shaped multilayered structures are arranged with an interval of 5–20 µm therebetween.

4. A semiconductor light emitting device according to claim 1, wherein the column-shaped multilayered structures are arranged in a matrix along a <11-2> crystal direction and a direction orthogonal to the <11-2> crystal direction over the silicon substrate.

5. A semiconductor light emitting device according to claim 1, wherein a cross-section of each column-shaped multilayered structure has the shape of a square or a rectangle.

6. A semiconductor light emitting device according to claim 1, wherein a cross-section of each column-shaped multilayered structure has the shape of a triangle.

7. A semiconductor light emitting device according to claim 1, wherein the length of each column-shaped multilayered structure along a direction orthogonal to the <11-2> crystal direction of the silicon substrate is 100 µm or smaller.

8. A semiconductor light emitting device according to claim 1, wherein the electrode which connects the column-shaped multilayered structures to one another is a transparent electrode which allows transmission of light emitted by the column-shaped multilayered structures through the transparent electrode.

9. A semiconductor light emitting device according to claim 1, wherein the electrode which connects the column-shaped multilayered structures to one another is provided with a bonding electrode for supplying an external electric current to the electrode.

10. A semiconductor light emitting device according to claim 1, wherein the column-shaped multilayered structures emit light having the same wavelength.

11. A semiconductor light emitting device according to claim 1, wherein light emitted by each of the column-shaped multilayered structures has any of a plurality of predetermined different wavelengths.

12. A semiconductor light emitting device according to claim 1, wherein adjacent column-shaped multilayered structures are electrically connected by a conductor.

* * * * *